(12) United States Patent
Ikushima

(10) Patent No.: US 8,251,261 B2
(45) Date of Patent: Aug. 28, 2012

(54) LIQUID DELIVERY APPARATUS

(75) Inventor: Kazumasa Ikushima, Mitaka (JP)

(73) Assignee: Musashi Engineering, Inc., Mitaka-shi, Tokyo (JP)

( * ) Notice: Subject to any disclaimer, the term of this patent is extended or adjusted under 35 U.S.C. 154(b) by 1028 days.

(21) Appl. No.: 11/814,226

(22) PCT Filed: Jan. 18, 2006

(86) PCT No.: PCT/JP2006/300627
§ 371 (c)(1),
(2), (4) Date: Sep. 4, 2008

(87) PCT Pub. No.: WO2006/077875
PCT Pub. Date: Jul. 27, 2006

(65) Prior Publication Data

US 2009/0120357 A1    May 14, 2009

(30) Foreign Application Priority Data

Jan. 18, 2005   (JP) ................................ 2005-010968

(51) Int. Cl.
*B05C 5/00* (2006.01)
(52) U.S. Cl. .......................... 222/394; 222/61; 137/884
(58) Field of Classification Search ............ 222/61, 222/394, 396, 397, 55; 137/884
See application file for complete search history.

(56) References Cited

U.S. PATENT DOCUMENTS

| | | | |
|---|---|---|---|
| 4,819,842 A | 4/1989 | Wetervelt | |
| 5,199,607 A * | 4/1993 | Shimano | 222/55 |
| 5,482,553 A | 1/1996 | Loftin et al. | |
| 5,699,834 A | 12/1997 | Hayashi et al. | |

FOREIGN PATENT DOCUMENTS

| | | |
|---|---|---|
| CN | 1155638 A | 7/1997 |
| FR | 2324898 | 4/1977 |
| FR | 2636547 A1 | 3/1990 |
| JP | 64-038304 U | 3/1989 |
| JP | 2-56271 A | 2/1990 |
| JP | 4-327001 A | 11/1992 |
| JP | 3000064 U | 6/1994 |
| JP | 3000064 U | 7/1994 |
| JP | 10-047516 A | 2/1998 |
| JP | 10-128208 A | 5/1998 |

(Continued)

OTHER PUBLICATIONS

European Search Report dated Jun. 12, 2008, issued in corresponding European Patent Application No. 06711896.8.

(Continued)

*Primary Examiner* — J. Casimer Jacyna
(74) *Attorney, Agent, or Firm* — Westerman, Hattori, Daniels & Adrian, LLP

(57) ABSTRACT

[Object] To provide a liquid delivery apparatus capable of cutting the number of installation steps, eliminating the necessity of connectors such as couplings, and reducing the apparatus size.

[Solving Means] The liquid delivery apparatus comprises a pressure reducing valve for adjusting pressure of pressurized gas, a pressure supply joint for supplying the pressurized gas having the adjusted pressure, and a solenoid valve for selectively establishing or cutting off communication between the pressure reducing valve and the pressure supply joint. The solenoid valve and the pressure reducing valve are arranged integrally with a manifold having channels formed therein. The solenoid valve and the pressure reducing valve are arranged on outer surfaces of the manifold.

8 Claims, 4 Drawing Sheets

FOREIGN PATENT DOCUMENTS

| | | |
|---|---|---|
| JP | 11-22699 A | 1/1999 |
| JP | 11-166652 A | 6/1999 |
| JP | 11-244757 A | 9/1999 |
| JP | 11244757 A | 9/1999 |

OTHER PUBLICATIONS

"Automated Equipment Decreases Worker Fatigue", Machine Design, vol. 63, No. 8, p. 34, Apr. 25, 1991.

Chinese Office Action dated Dec. 21, 2010, issued in corresponding Chinese Patent Application No. 200680002567.6.

Notification of Reason for Refusal dated Apr. 28, 2011, issued in corresponding Japanese Patent Application No. 2005-010968.

Notification of Reasons for Refusal dated Apr. 28, 2011, issued in corresponding Japanese Patent Application No. 2005-010968.

* cited by examiner

[Fig. 1]
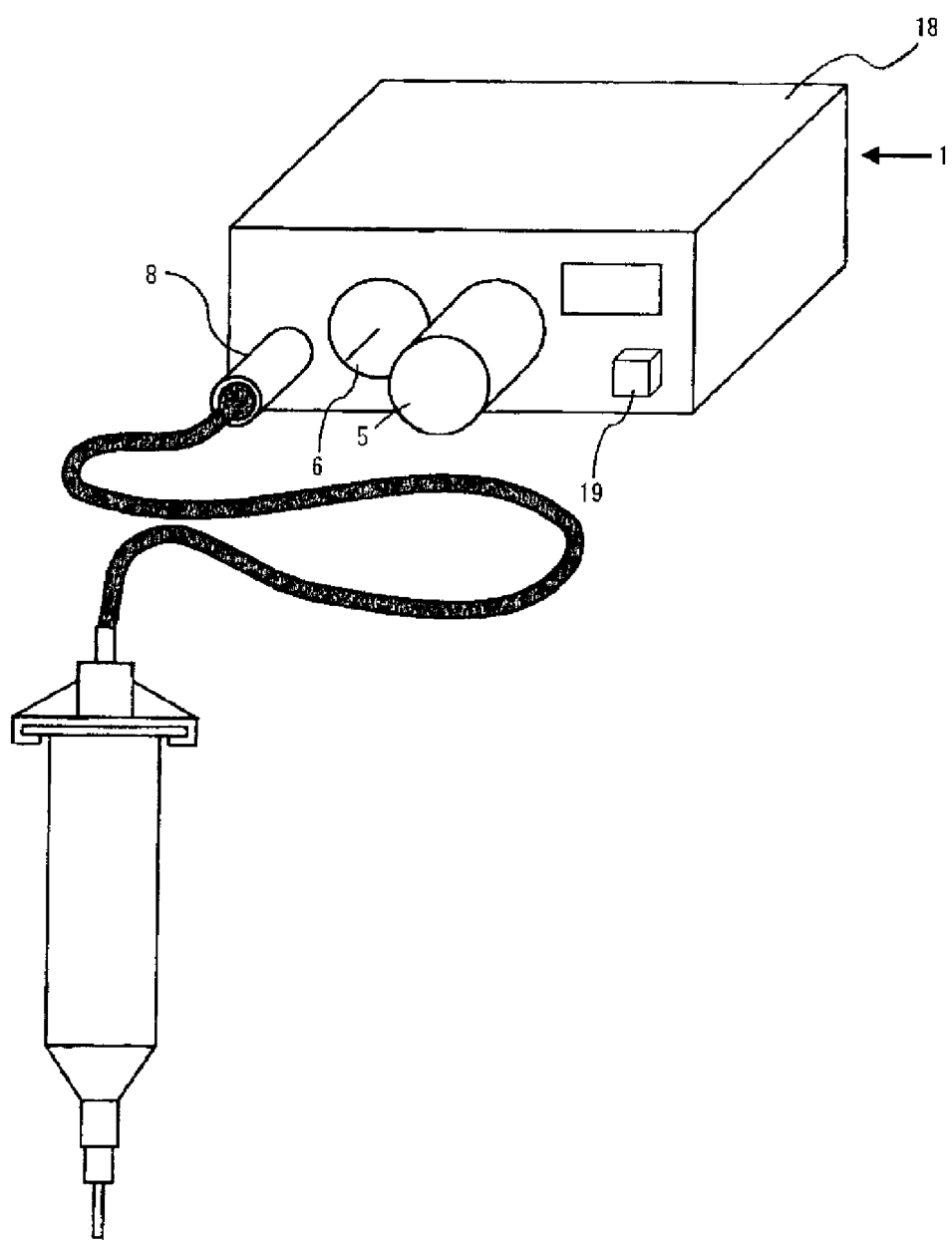

[Fig. 2]
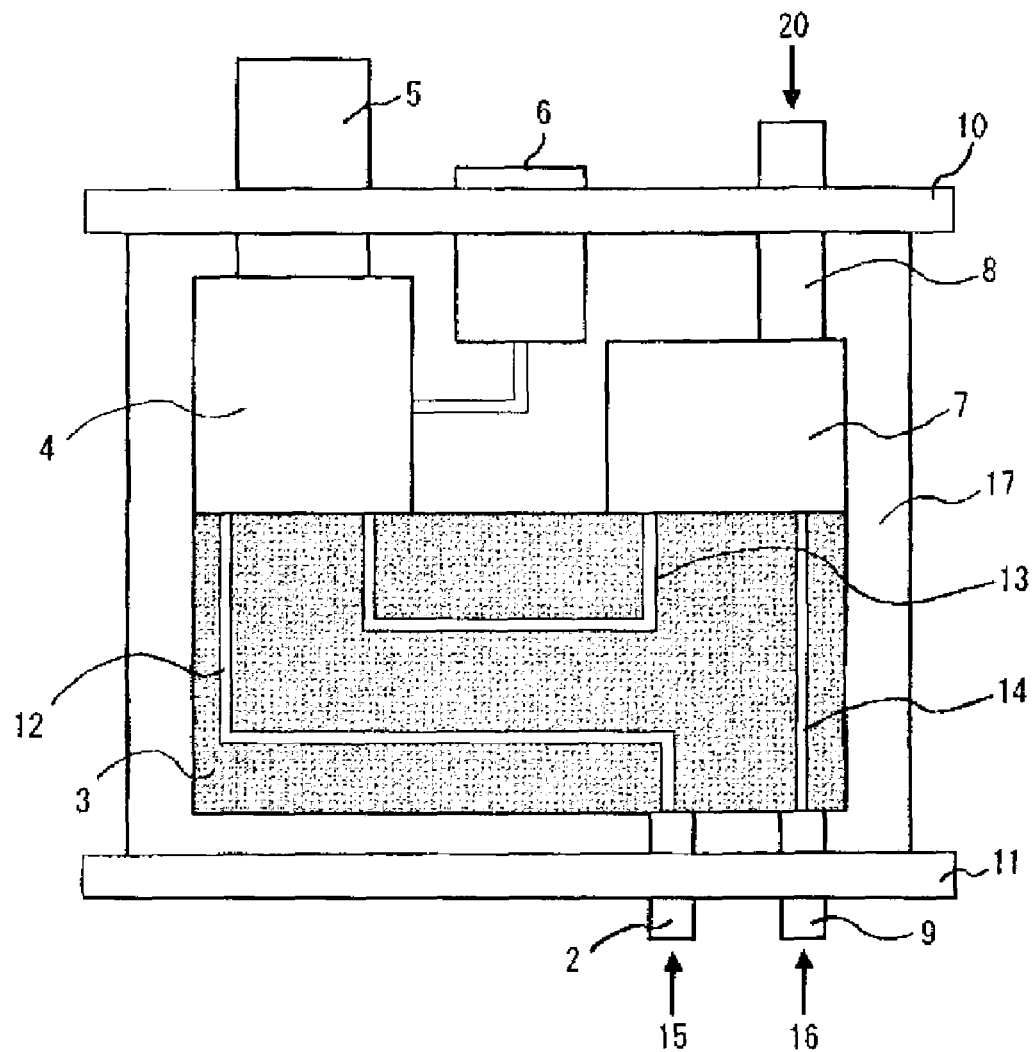

[Fig. 3]
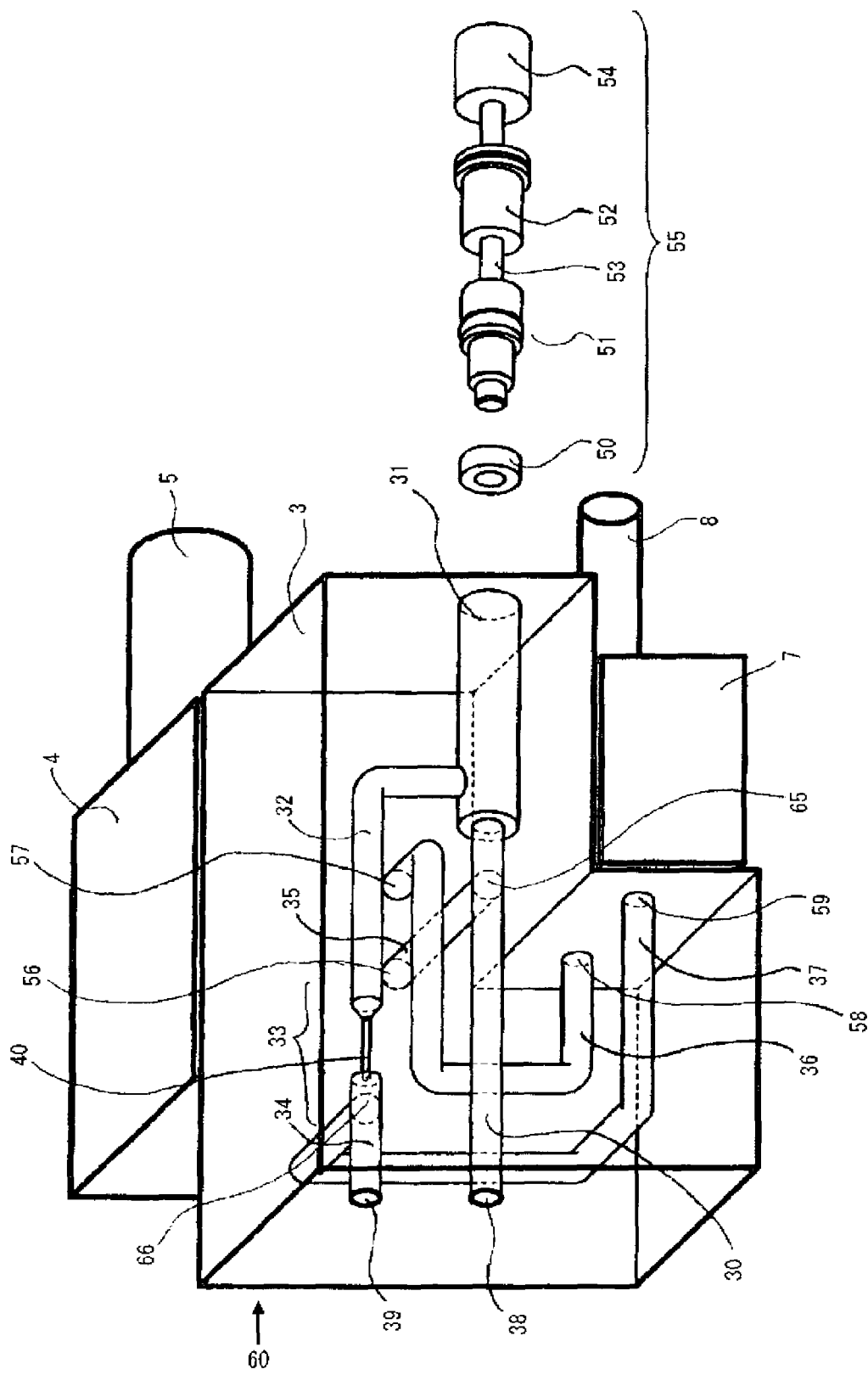

[Fig. 4]
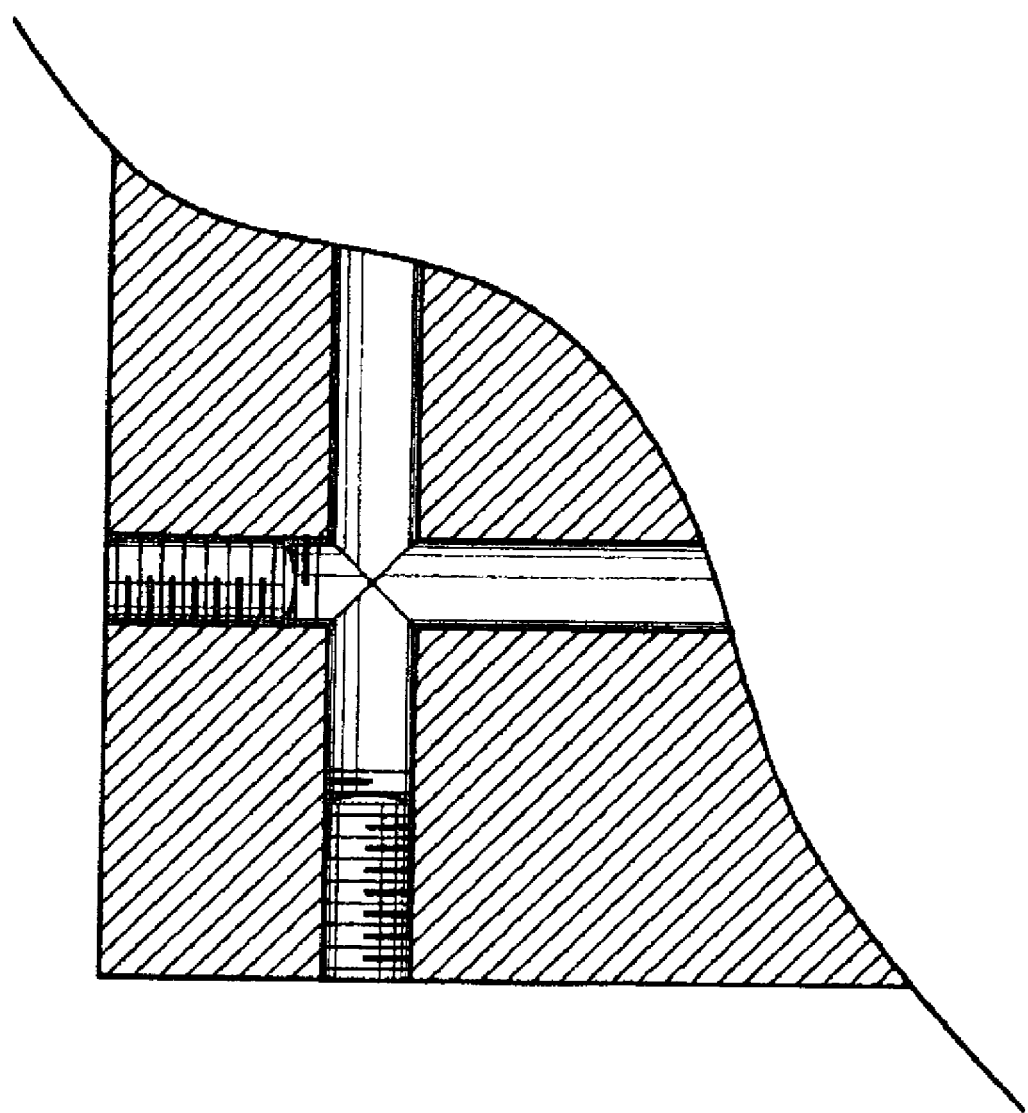

LIQUID DELIVERY APPARATUS

TECHNICAL FIELD

The present invention relates to a liquid delivery apparatus for delivering liquid materials including viscous liquids, such as paste materials and adhesives.

BACKGROUND ART

Hitherto, there has been known an apparatus for delivering a liquid in fixed amount under air pressurization. In a die bonding apparatus, for example, it is general that a fixed amount of paste is delivered from a syringe onto a circuit board, and a die is bonded to the delivered paste. The known paste delivery device, however, has a difficulty in continuously and precisely delivering the fixed amount of paste because transmission of pressure is slowed as the amount of paste remaining in the syringe reduces.

To overcome such a difficulty, the applicant previously invented a fixed-amount-of-liquid delivery apparatus comprising a solenoid selector valve disposed between a syringe and an air supply source, an accumulator disposed in a second line connecting the solenoid selector valve and the air supply source, and a pressure sensor disposed in each of the second line and a first line connecting the solenoid selector valve and the syringe, wherein a pressure change caused by a change in the remaining amount of liquid is measured and opening/closing of the solenoid selector valve is controlled in accordance with the measured result (Patent Document 1).

[Patent Document 1] Japanese Patent Laid-Open No. 2-56271

DISCLOSURE OF THE INVENTION

Problems to be Solved by the Invention

Recent customer needs are mainly divided into twos, i.e., one placing importance to "function", and the other placing importance to "size and cost" "high function", which represents a trend demanding a smaller-sized and lower-cost product with the least necessary function. The former need can be satisfied with the invention proposed in Patent Document 1, but an effective solution has not yet proposed for the latter need. In particular, the latter need is high in work sites employing production systems based on labor-intensive method.

Because the apparatus of Patent Document 1 includes pneumatic devices, such as a solenoid valve and a pressure reducing valve, communicated with each other through pipes, the arrangement of those devices requires a space for routing the pipes, and a relatively large space has to be prepared for installation of the apparatus. In a manual work site, particularly, it is demanded how far a space required on a work desk can be reduced.

Also, because of the arrangement including the pneumatic devices, such as the solenoid valve and the pressure reducing valve, communicated with each other through the pipes, complicated piping work is required for connection between the pneumatic devices and the pipes. For example, when the pneumatic devices and the pipes are connected to each other, connectors (couplings) are used and, prior to connecting the pneumatic devices and the pipes, the connectors must be joined to the pneumatic devices in advance. Further, the apparatus structure requires a large number of connectors to be attached and therefore requires a large number of steps for assembly.

The pipes are usually made of urethane, nylon, polyolefin or the like, and such resin-made pipes have elasticity and are hard to prepare in even length. Further, those pipes tend to not only slightly incline leftward or rightward, but also to curl when laid. As a result, a lot of time and labor are required for laying the pipes.

In view of the above-mentioned problems in the art, an object of the present invention is to provide a liquid delivery apparatus capable of cutting the number of installation steps, eliminating the necessity of connectors such as couplings, and reducing the apparatus size.

Means for Solving the Problems

To solve the above-mentioned problems, the inventor has succeeded in eliminating the necessity of connectors for pneumatic devices and minimizing adverse influences of elastic pipes by integrally arranging a solenoid valve and a pressure reducing valve in a manifold having channels formed therein.

More specifically, the present invention resides in a liquid delivery apparatus featured as follows.

According to a first aspect, the present invention provides a liquid delivery apparatus comprising a pressure reducing valve for adjusting pressure of pressurized gas, a pressure supply joint for supplying the pressurized gas having the adjusted pressure, and a solenoid valve for selectively establishing or cutting off communication between the pressure reducing valve and the pressure supply joint, the solenoid valve and the pressure reducing valve being arranged integrally with a manifold having channels formed therein.

According to a second aspect of the present invention, in the liquid delivery apparatus according to the first aspect, the solenoid valve and the pressure reducing valve are arranged on outer surfaces of the manifold.

According to a third aspect of the present invention, in the liquid delivery apparatus according to the first or second aspect, the manifold includes a first channel for communicating the pressure reducing valve and the pressure supply joint with each other, and a second channel for communicating the pressure reducing valve and the solenoid valve with each other.

According to a fourth aspect of the present invention, in the liquid delivery apparatus according to the first, second or third aspect, the manifold is directly connected to the pressure reducing valve, the pressure supply joint, and the solenoid valve.

According to a fifth aspect of the present invention, in the liquid delivery apparatus according to one of the first to fourth aspect, the pressure supply joint is directly connected to the solenoid valve.

According to a sixth aspect of the present invention, in the liquid delivery apparatus according to one of the first to fifth aspect, the pressure reducing valve is provided with a pressure adjusting knob directly connected to the pressure reducing valve.

According to a seventh aspect of the present invention, in the liquid delivery apparatus according to one of the first to sixth aspect, the manifold further includes a channel serving as an ejector for generating negative pressure.

According to an eighth aspect of the present invention, in the liquid delivery apparatus according to one of the seventh aspect, the channel serving as an ejector is a third channel for communicating the solenoid valve and a pressure release port with each other inside the manifold.

According to a ninth aspect of the present invention, in the liquid delivery apparatus according to one of the eighth aspect, the channel serving as an ejector further includes a fourth channel for communicating the first channel and the third channel with each other inside the manifold, the fourth channel having a smaller inner diameter in a portion near a junction with the third channel.

According to a tenth aspect of the present invention, the liquid delivery apparatus according to one of the first to ninth aspect further comprises a control valve having a valve member which slides in close contact with an inner wall surface of a channel inside the manifold.

According to an eleventh aspect of the present invention, in the liquid delivery apparatus according to one of the tenth aspect, the control valve selectively establishes or cut off communication between the first channel and the fourth channel at a junction between the first channel and the fourth channel.

Advantages of the Invention

According to the present invention, a space required for installing the liquid delivery apparatus can be greatly cut as compared with the known liquid delivery apparatus.

Also, since a space required for routing pipes and a space required for laying the pipes are no longer required, the size of the liquid delivery apparatus can be reduced and the installation space can be cut.

Further, since piping work is also no longer required, the necessity of connectors (couplings) for the piping is eliminated and the number of installation steps can be greatly cut.

In addition, since the channels bored in the manifold are used instead of pipes connecting pneumatic equipment to each other, it is possible to avoid the influences of elasticity and variations in length of the pipes, and to hold the channel lengths even, thus resulting in a product with higher quality than that obtained with the known liquid delivery apparatus.

BRIEF DESCRIPTION OF THE DRAWINGS

FIG. 1 is a perspective view of a liquid delivery apparatus according to Embodiment 1.

FIG. 2 is a schematic plan view of an air circuit in the liquid delivery apparatus according to Embodiment 1.

FIG. 3 is a perspective view of a manifold according to Embodiment 2, the view seeing through the manifold to show the internal.

FIG. 4 is an explanatory view for explaining a method of forming channels communicated to the manifold.

REFERENCE NUMERALS

1: main unit
2: pressure supply joint
3: manifold
4: regulator (pressure reducing valve)
5: knob
6: pressure gauge
7: solenoid valve
8: delivery pressure supply joint
9: pressure release joint
10: front panel
11: rear panel
12: first channel
13: second channel
14: third channel
15: pressure supply port
16: pressure release port
17: base
18: cover
19: delivery button
20: delivery pressure supply port
30: A channel
31: valve chamber
32: B channel
33: smaller-diameter channel
34: C channel
35: D channel
36: E channel
37: F channel
38: inlet port
39: outlet port
40: thin channel
50: valve seat
51: valve member
52: fixture
53: shaft
54: thumb
55: flow control valve
56: pressure-reducing-valve primary pressure port
57: pressure-reducing-valve secondary pressure port
58: solenoid valve A-side port
59: solenoid valve B-side port
60: manifold
65: A branch port
66: B branch port

BEST MODE FOR CARRYING OUT THE INVENTION

The best mode for carrying out the present invention will be described below in connection with embodiments, but the present invention is in no way limited to the following embodiments.

Embodiment 1

FIG. 1 is an external perspective view of a main unit of the liquid delivery apparatus according to Embodiment 1, and FIG. 2 is a schematic plan view of an air circuit constituted in the liquid delivery apparatus.

(Casing) An outer casing of a main unit 1 comprises a base 17, a front panel 10 and a rear panel 11 each arranged at opposite ends of the base 17 to vertically erect upward, and a cover 18. The front panel 10 is provided with a knob 5, a pressure gauge 6, a delivery pressure supply joint 8, and a delivery button 19. An air circuit and an electric circuit are disposed within the main unit 1. A bottom surface of the main unit 1 has an area of about 10 cm×10 cm.

(Construction) A shaded region in FIG. 2 represents a manifold 3. The manifold 3 has first to third channels formed therein. A pressure reducing valve 4 and a solenoid valve 7 are fixedly mounted directly on an outer surface of the manifold 3 in a region closer to the front side. A pressure supply joint 2 having a pressure supply port 15 and a pressure release joint 9 having a pressure release port 16 are connected to the back side of the manifold 3.

The pressure supply joint 2 and the pressure reducing valve 4 are communicated with each other via a first channel 12 formed in the manifold 3, the pressure reducing valve 4 and the solenoid valve 7 are communicated with each other via a second channel 13, and the solenoid valve 7 and the pressure release joint 9 are communicated with each other via a third channel 14. While the manifold 3 is made of aluminum in this embodiment, the material of the manifold 3 is not limited to particular one and a plastic resin can also be used as the manifold material.

The pressure reducing valve 4 is connected to the pressure gauge 6 so that the supplied pressure can be confirmed by the pressure gauge 6. The knob 5 is manipulated to regulate the pressure reducing valve 4. Further, the solenoid valve 7 is communicated with the delivery pressure supply joint 8 having a the delivery pressure supply port 20.

With the construction described above, the pressure supply joint 2, the pressure release joint 9, the pressure reducing valve 4, the pressure gauge 6, the solenoid valve 7, and the delivery pressure supply joint 8 can be provided integrally with the manifold 3. This means that a pneumatic circuit can be assembled as an integral unit in advance. In other words, by fixing such an integral unit to the base 17, the entirety of the pneumatic circuit can be fixedly mounted to the main unit 1. In assembly, the knob 5 of the pressure reducing valve 4, the pressure gauge 6, and the delivery pressure supply joint 8 are arranged so as to penetrate through the front panel 10 and project or extend forward of a front surface of the front panel 10. The pressure release joint 9 and the pressure supply joint 2 are arranged so as to penetrate through the rear panel 11 and project backward.

(Delivery Process) Connected to the pressure supply joint 2 is a pressure feed pipe (not shown) through which pressurized air produced by a compressor (not shown) or the like is supplied. The pressurized air supplied through the pressure feed pipe is supplied to the interior of the main unit 1 through the pressure supply port 15 of the pressure supply joint 2. Then, the pressurized air is sent to the primary pressure side of the pressure reducing valve 4 via the first channel 12 in the manifold 3. At the pressure reducing valve 4, the pressure is adjusted to a specified level by rotating the knob 5. Thereafter, the pressurized air is sent to the solenoid valve 7 via the second channel 13 in the manifold 3, which is communicated with the secondary side of the pressure reducing valve 4. The solenoid valve 7 is usually closed, but it is opened upon pushing of the delivery button 19 so that the pressurized air is sent to the delivery pressure supply joint 8.

The delivery pressure supply joint 8 is communicated with a pipe for supplying pressure to a liquid material stored in a syringe. After the pressure has been applied for a predetermined time from the delivery pressure supply joint 8 to the liquid material for delivering it, the solenoid valve 7 is shifted to a position where the delivery pressure supply joint 8 and the second channel 13 in the manifold 3 are communicated with each other. Upon this valve shift, the compressed air having been supplied from the delivery pressure supply joint 8 to the syringe is released to the atmosphere via the third channel 14 from the release port 16 of the pressure release joint 9. As a result, the pressure in the syringe is lowered to a level substantially equal to the atmospheric pressure, whereby undesired liquid dripping can be prevented.

Embodiment 2

In a liquid delivery apparatus of Embodiment 2, a vacuum mechanism is added to the liquid delivery apparatus of Embodiment 1.

(Construction) As shown in FIG. 3, a manifold 60 is substantially hook-shaped when viewed from side, and has a space at a lower front corner. An inlet port 38 for supplying pressurized air and an outlet port 39 for releasing the pressurized air are provided on the rear side of the manifold 60. A pressure supply joint 2 is preferably connected to the inlet port 38 as in Embodiment 1, and a pressure release joint 9 can be connected to the outlet port 39 as in Embodiment 1.

A flow control valve 55 for adjusting negative pressure is disposed in an upper front region of the manifold 60 at a position in communication with an A channel. A solenoid valve 7 is disposed in the space at the lower front corner of the manifold 60, while a solenoid valve A-side port 58 and a solenoid valve B-side port 59 both communicating with the solenoid valve 7 are formed in a surface of the manifold 60 defining the corner space.

A pressure-reducing-valve primary pressure port 56 and a pressure-reducing-valve secondary side port 57 both communicating with a pressure reducing valve 4 are formed in a right side surface of the manifold 60, and the pressure reducing valve 4 is disposed on the right side surface of the manifold 60.

(Channels) Channels formed in the manifold 60 will be described below.

An A channel 30 communicates the inlet port 38 with a valve chamber 31 in which the flow control valve 55 is disposed. The A channel 30 has an A branch port 65 for branch to a D channel 35 at a position near a junction with the flow control valve 55.

A B channel 32 communicates the valve chamber 31 and a thin channel 40 with each other.

A C channel 34 communicates the thin channel 40 and the outlet port 39 with each other.

The D channel 35 has the pressure-reducing-valve primary pressure port 56 formed at its one end and is communicated at its other end with the A channel 30 through the branch port 65.

An E channel 36 communicates the pressure-reducing-valve secondary side port 57 and the solenoid valve A-side port 58. The solenoid valve 7 is also communicated with one end of an F channel 37 through the solenoid valve B-side port 59. The other end of the F channel 37 is communicated with a branch port 66 formed midway the C channel 34.

(Delivery Process) Pressurized air supplied to the inlet port 38 flows through two passages, i.e., one directing from the A channel 30 to the pressure reducing valve 4 via the D channel 35 and the other branched to the valve chamber 31 which is adjacent to the A channel 30.

The former flow (i.e., the pressurized air distributed to the D channel 35 from the A channel 30) is sent from the pressure-reducing-valve primary pressure port 56 to the primary pressure side of the pressure reducing valve 4 and is adjusted to an appropriate pressure by the pressure reducing valve 4. Then, the pressurized air is returned from the secondary pressure side of the pressure reducing valve 4 to the pressure-reducing-valve secondary pressure port 57 of the manifold 60, followed by being sent to the solenoid valve A-side port 58 via the E channel 36. The solenoid valve 7 can be selectively shifted between a first position where the solenoid valve A-side port 58 and the delivery pressure supply joint 8 are communicated with each other and a second position where the solenoid valve B-side port 59 and the delivery pressure supply joint 8 are communicated with each other. In a standby state prior to starting the delivery operation, the solenoid valve 7 is held at the second position to prevent the pressurized air supplied to the solenoid valve A-side port 58 and adjusted to the appropriate pressure from passing through the solenoid valve 7.

The latter flow (i.e., the pressurized air distributed to the valve chamber 31 from the A channel 30) is regulated in its flow rate by the flow control valve 55 within the valve chamber 31. When the flow control valve 55 is fully closed, the pressurized air supplied from the A channel 30 is never allowed to flow into the B channel 32 via the valve chamber 31. When the flow control valve 55 is opened, the pressurized air in the A channel 30 is sent to the thin channel 40 via the valve chamber 31 and then the B channel 32.

The thin channel 40 is formed in diameter smaller than that of the B channel 32 so that the pressurized air sent to the thin channel 40 flows through the thin channel 40 while increasing a flow speed and is released to the atmosphere from the outlet port 39 via the C channel 34. On that occasion, at a B branch port formed in the C channel 34 near its closer to the thin channel 40, there occurs a flowage force directing from the F channel 37 to the C channel 34 because of the flow of the pressurized air passing through the thin channel 40 at an increased speed. As a result, the pressure in the F channel 37 is dropped.

Further, because the solenoid valve 7 is in the second position where the solenoid valve B-side port 59 and the delivery pressure supply joint 8 are communicated with each other, the pressure drop in the F channel 37 acts on the delivery pressure supply joint 8 communicating with the F channel 37 via the solenoid valve 7 and then acts on the interior of the syringe (liquid reservoir) communicating with the delivery pressure supply joint 8 through a pipe connected to the delivery pressure supply joint 8. The pressure drop in the F channel 37 depends on the flow speed of the pressurized air flowing through the thin channel 40, and the flow speed of the pressurized air is decided depending on the opening degree of the flow control valve 55. By regulating the opening degree of the flow control valve 55, therefore, it is possible to act negative pressure at an appropriate level depending on the amount of the liquid material remaining in the liquid reservoir, and to prevent the liquid from dropping unintentionally from a nozzle attached to a tip of the liquid reservoir.

In that way, during the standby state prior to starting the delivery operation, the pressurized air supplied to the inlet port 38 is released from the outlet port 39 depending on the opening degree of the flow control valve 55, and the negative pressure is caused to act on the liquid reservoir communicating with the delivery pressure supply joint 8 to prevent the unintentional liquid dripping.

On the other hand, during the delivery operation, the solenoid valve 7 is shifted from the second position where the solenoid valve B-side port 59 and the delivery pressure supply joint 8 are communicated with each other to the first position where the solenoid valve A-side port 58 and the delivery pressure supply joint 8 are communicated with each other. Accordingly, the pressurized air supplied to the solenoid valve A-side port 58 and adjusted to the appropriate pressure passes through the solenoid valve 7 and acts on the liquid reservoir through the delivery pressure supply joint 8 so that the liquid can be delivered as intended with the action of the pressurized air adjusted to the appropriate pressure.

After the end of the liquid delivery operation, the solenoid valve 7 is shifted to the second position, whereby the air in the liquid reservoir communicating with the delivery pressure supply joint 8 is released through the outlet port 39 and the negative pressure specified by the flow control valve 55 is caused to act on the liquid reservoir communicating with the delivery pressure supply joint 8.

(Flow Control Valve) As shown in FIG. 3, the flow control valve 55 is constructed as follows, A valve seat 50 is inserted and fixed in the valve chamber 31 at its innermost position adjacent to the A channel 30.

A shaft 53 is screwed to a fixture 52, and has a valve member 51 provided at its front end and a thumb 54 provided at its rear end.

The fixture 52 is fixed to an upper front region of the manifold 60. By rotating the thumb 54, the valve member 51 and the valve seat 50 are relatively moved through the spirally sliding action between the fixture 52 and the shaft 53 such that the valve member 51 and the valve seat 50 are contacted with or spaced away from each other.

(Method of Forming Channel) The channels in the manifold 60 can be formed, by way of example, as shown in FIG. 4. More specifically, penetration holes are formed through a predetermined block by a boring means, e.g., a drill, and unnecessary portions of the bored holes are closed by inserting screw plugs so that the desired channels are formed.

As an alternative, the channels can also be formed by preparing an upper side block and a lower side block, forming grooves in each of the upper and lower side blocks, and then bonding both the blocks to each other.

Of course, the manifold structure is not limited to a double-layered structure comprising the upper and lower side blocks bonded to each other. The manifold may be of a multi-layered structure prepared by forming grooves one or both surfaces of each of plural blocks and combining them in stacked relation.

INDUSTRIAL APPLICABILITY

The present invention can be applied to not only high-function products capable of finely adjusting the amount of delivered liquid with the use of a pressure sensor, but also to inexpensive products not having such finely adjusting function. Further, the present invention is applicable to products in wide ranges requiring liquid feed under pressure without being limited to delivery and coating.

The invention claimed is:

1. A liquid delivery apparatus comprising
a pressure supply joint;
a pressure reducing valve for adjusting pressure of pressurized gas from the pressure supply joint;
a delivery pressure supply joint for supplying the pressurized gas to a liquid material, a solenoid valve for selectively establishing or cutting off communication between the pressure reducing valve and the delivery pressure supply joint,
a manifold having channels formed therein, and
a pressure release port for releasing the pressurized gas,
wherein the solenoid valve and the pressure reducing valve are arranged integrally with the manifold,
wherein the manifold includes a first channel for communicating the pressure reducing valve and the pressure supply joint with each other, and a second channel for communicating the pressure reducing valve and the solenoid valve with each other, a third channel to communicate with the pressure release port, a fourth channel for communicating the first channel and the third channel with each other, and a valve chamber for communicating the first channel and the fourth channel with each other,
the solenoid valve is a selector valve for switching communication of the delivery pressure supply joint with the second channel or the third channel, and
a liquid dripping preventing mechanism is constituted with a valve inserted in the valve chamber.

2. The liquid delivery apparatus according to claim 1, wherein the pressure reducing valve, the pressure supply joint, the delivery pressure supply joint, the solenoid valve, and the manifold are constituted as a unit capable of being integrally assembled in advance, the unit being fixable to the base.

3. The liquid delivery apparatus according to claim 1, wherein the valve in the valve chamber is a flow control valve including a valve member which slides in close contact with an inner wall surface of the valve chamber, the fourth channel has a thin channel near a junction point with the third channel, and the liquid dripping preventing mechanism is capable of adjusting a flow rate in the first channel and the fourth channel depending on an opening degree of the valve.

4. The liquid delivery apparatus according to claim 3, wherein the flow control valve comprises an annular valve seat inserted in and fixed to an innermost portion of the valve chamber, a shaft screwed to a fixture, a valve member provided at a front end of the shaft, and a knob provided at a rear end of the shaft.

5. The liquid delivery apparatus according to claim 1, wherein the manifold is formed in a substantially L-shape with a space left on a front lower side, and the solenoid valve is face-joined to the space left on the front lower side.

6. The liquid delivery apparatus according to claim 5, wherein the pressure reducing valve is face jointed to a side surface of the manifold.

7. The liquid delivery apparatus according to claim 1, wherein the pressure reducing valve includes a pressure adjusting knob directly coupled to the pressure reducing valve.

8. The liquid delivery apparatus according to claim 1, wherein the manifold consists of a solid block.

\* \* \* \* \*